United States Patent [19]
Hara et al.

[11] Patent Number: 4,725,982
[45] Date of Patent: Feb. 16, 1988

[54] TRI-STATE BUFFER CIRCUIT

[75] Inventors: Hiroyuki Hara, Tokyo; Yasuhiro Sugimoto, Yokohama, both of Japan

[73] Assignee: Kabushiki Kaisha Toshiba, Kawasaki, Japan

[21] Appl. No.: 845,540

[22] Filed: Mar. 28, 1986

[30] Foreign Application Priority Data

Mar. 29, 1985 [JP] Japan .................................. 60-63812

[51] Int. Cl.[4] ...................... G11C 11/34; G11C 11/56; G11C 7/00; H01L 27/02
[52] U.S. Cl. .................................... 365/168; 365/177; 307/473; 357/43
[58] Field of Search ................ 365/168, 177; 307/473; 357/43

[56] References Cited

U.S. PATENT DOCUMENTS

| 3,602,733 | 8/1971 | Aoki ..................................... 307/473 |
| 4,280,065 | 7/1981 | Minato et al. ........................ 307/473 |
| 4,380,709 | 4/1983 | Au ........................................ 307/473 |

FOREIGN PATENT DOCUMENTS

| 0099100 | 1/1984 | European Pat. Off. . |
| 0132822 | 2/1985 | European Pat. Off. . |
| 0145004 | 6/1985 | European Pat. Off. . |

OTHER PUBLICATIONS

W. J. Scarpero, Jr., "Field-Effect Transistor Bidirectional Driver Control Circuit", IBM Technical Disclosure Bulletin, vol. 16, No. 8, Jan. 1984, p. 2442.
Patent Abstracts of Japan, vol. 2, No. 112(E-78)(6086), Sep. 16, 1978; & JP-A-53 76 719, Jul. 7, 1978 (Fujitsu K.K.).

Primary Examiner—A. J. Heinz
Assistant Examiner—Alyssa H. Bowler
Attorney, Agent, or Firm—Schwartz, Jeffery, Schwaab, Mack, Blumenthal & Evans

[57] ABSTRACT

A tri-state buffer circuit according to the present invention comprises a switching circuit connected to an input terminal (IN), tri-state and inverted tri-state input terminals (T, $\overline{T}$), and a first power supply terminal for generating first and second switching signals (A, B) which have a first and second levels, respectively, only when the tri-state signal is on a first level, regardless the level of the input signal; an inverter circuit connected to said switching circuit, and the first power supply terminal for inverting the first switching signal (A) from said switching circuit as an output signal; a selection circuit connected to said switching circuit and inverter circuit for maintaining a signal, which have a second level, equal to the inverted signal only when the tri-state signal is on first level; a first type bipolar transistor whose base is connected to said inverter circuit, whose collecter is connected to the first power supply terminal, and whose emitter is connected to the output terminal of the tri-state circuit; and a first type bipolar transister whose base is connected to said selection circuit, whose collecter is connected to the output terminal of the tri-state circuit, and whose emitter is connected to a second power supply terminal.

6 Claims, 5 Drawing Figures

TRI-STATE BUFFER CIRCUIT

BACKGROUND OF THE INVENTION

1. Field of the Invention

The present invention relates to a tri-state buffer circuit which is small in size but possesses a large current capacity.

2. Description of the Prior Art

Along with the increase in the degree of integration of integrated circuits due to advancement in recent years of semiconductor technology, power consumption in a chip is showing an increasing tendency. For this reason, reduction in the power consumption is being attempted lately by constructing integrated circuits by the use of CMOS circuits that have low power consumption.

Figure 1:
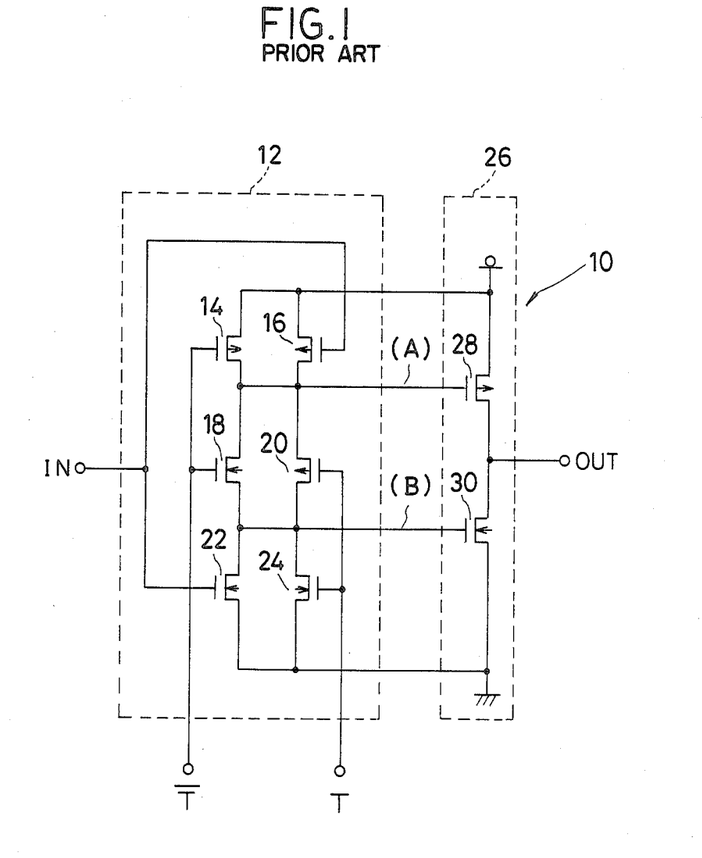
FIG. 1 is a circuit diagram for a prior tri-state buffer circuit constructed by using CMOS circuit.

Referring to FIG. 1, a prior example of the tri-state buffer circuit constructed with CMOS circuits is shown with reference numeral 10. The prior tri-state buffer circuit 10 has a switching unit 12 which generates switching signals (A) and (B) based on an input signal, a tri-state signal T, and an inverted tri-state signal $\overline{T}$. The switching unit 12 consists of P-channel MOS transistors (referred to as "PMOS" hereafter) 14 and 16 that are connected in parallel, an N-channel MOS transistor (referred to as "NMOS" hereafter) 18 and PMOS 20 that are connected in parallel, and NMOS 22 and 24 that are connected in parallel. Further, the source terminals of PMOS 14 and 16 that are connected in parallel are connected to a voltage source Vcc, the source terminals of NMOS 22 and 24 that are connected in parallel are connected to the ground, and the respective pairs of transistors that are connected in parallel described above are connected in series. Moreover, the gate terminals of the PMOS 16 and the NMOS 22 are connected to an input terminal IN to which is input a signal to be buffered, the gate terminals of the PMOS 20 and the NMOS 24 are connected to a tri-state terminal T to which is input a tri-state signal T, and the gate terminals of the PMOS 14 and the NMOS 18 are connected to an inverted tri-state terminal $\overline{T}$ to which is input an inverted tri-state signal $\overline{T}$.

The tri-state buffer circuit 10 further includes an output unit 26, and the output unit 26 is composed of a PMOS 28 that sends out a current from the voltage source Vcc to the output terminal OUT based on a switching signal (A) and an NMOS 30 that sends in a current from the output terminal OUT to the ground based on a switching signal (B). The source terminal of the PMOS 28 is connected to the voltage source Vcc, its drain terminal is connected to the output terminal OUT, its gate terminal is connected to the drain terminals of the PMOS 14 and 16 that are connected in parallel, and a switching signal (A) that is generated in the switching unit 12 is supplied there. Further, the source terminal of the NMOS 30 is connected to the ground, its drain terminal is connected to the output terminal OUT, its gate terminal is connected to the drain terminals of the NMOS 22 and 24, and a switching signal (B) that is generated in the switching unit 12 is supplied there.

In a buffer circuit constructed as above, when the tri-state signal T is on high level (referred to as "H" level hereafter) and the inverted tri-state signal $\overline{T}$ is on low level (referred to as "L" level hereafter), the PMOS 14 becomes on-state and the NMOS 18 becomes off-state without depending upon the level of the input signal, that is, regardless of "H" or "L" level of the input signal level, and the switching signal (A) becomes "H" level and the switching signal (B) becomes "L" level. Further, both of the PMOS 28 and the NMOS 30 of the output unit 26 are in off-state, and the output terminal OUT becomes high impedance (HZ) state. On the contrary, when the tri-state signal T is on "L" level and the inverted tri-state signal $\overline{T}$ is on "H" level, the PMOS 14 is in off-state, the NMOS 18 is in on-state, the PMOS 20 is in on-state, and the NMOS 24 is in off-state. Further, when the input signal is on "L" level, the PMOS 16 is in on-state, the NMOS 22 is in off-state. Then, both of the switching signals (A) and (B) become "H" level so that the PMOS 28 becomes off-state and the NMOS 30 becomes on-state, a current flows from, for instance, a load resistance that is connected to the output terminal OUT to the ground via the NMOS 30, and the output terminal OUT becomes "L" level. Moreover, when the input signal is on "H" level, the PMOS 16 becomes off-state, the NMOS 22 becomes on-state, and both of the switching signals (A) and (B) become "L" level, so that the PMOS 28 becomes on-state, the NMOS 30 becomes off-state. Then, a current flows in from the voltage source Vcc through the PMOS 28 to, for example, a load capacity that is connected to the output terminal OUT so that the output terminal OUT becomes "H" level. Namely, the system functions as a buffer circuit.

Therefore, it will be seen that a tri-state buffer circuit with a construction as above performs a logic operation as shown in Table 1.

TABLE 1

| T | $\overline{T}$ | IN | (A) | (B) | OUT |
|---|---|---|---|---|---|
| L | H | L | H | H | L |
|   |   | H | L | L | H |
| H | L | — | H | L | HZ |

Now, in order to drive a large load by employing a buffer circuit with construction as above to, for instance, the line driver of a data bus line, it becomes necessary to increase the current driving capability of the MOS transistor in the output stage. Since, however, the current driving capability of a MOS transistor is ordinarily not high enough, the required increase in the current driving capability is arranged at present to be accomplished by increasing the gate width of the transistor. More precisely, in order to let the current be flowed through the PMOS 28 of the output unit 26 from the voltage source Vcc to the output terminal OUT be, for instance, about 55 mA (at an output voltage of 2.8 V), it is necessary to give an area of about 500 $\mu m^2$ for the gate of the MOS 28. Further, in order to let the current that is to be flowed in by the NMOS 30 from the output terminal OUT to the ground be about 30 mA (at an output voltage of 1.0 V), the gate area of the NMOS 30 has to be made to be about 250 $\mu m^2$. Therefore, to increase the current driving capability, it becomes necessary to set the occupying area of the transistor in the output stage to be considerably larger in comparison to the occupying area of other circuit elements. As a result, it has been an obstacle in raising the degree of integration of the tri-state buffer circuit.

SUMMARY OF THE INVENTION

An object of the present invention is to provide a tristate buffer circuit which permits making the system small in size, and at the same time, is capable of operating at high speed even under a load high capacity.

Another object of the present invention is to provide a tri-state buffer circuit which enables the reduction of the occupying area of the transistor in the output stage, as well as improving the current driving capability.

A tri-state buffer circuit according to the present invention comprises a switching circut (34) connected to an input terminal (IN), tri-state and inverted tri-state input terminals (T, T̄), and a first power supply terminal for generating first and second switching signals (A, B) which have a first and second levels, respectively, only when the tri-state signal is on a first level, regardless the level of the input signal; an inverter circuit (36) connected to said switching circuit (34), and the first power supply terminal for inverting the first switching signal (A) from said switching circuit (34) as an output signal; a selection circuit (38) connected to said switching circuit and inverter circuit for maintaining a signal, which have a second level, equal to the inverted signal only when the tri-state signal is on first level; a first type bipolar transistor (60) whose base is connected to said inverter circuit (36), whose colleter is connected to the first power supply terminal, and whose emitter is connected to the output terminal of the tri-state circuit; and a first type bipolar transistor (62) whose base is connected to said selection circuit (38), whose collector is connected to the output termnal of the tri-state circuit, and whose emitter is connected to a second power supply terminal.

DESCRIPTION OF THE PREFERRED EMBODIMENTS

Figure 2:
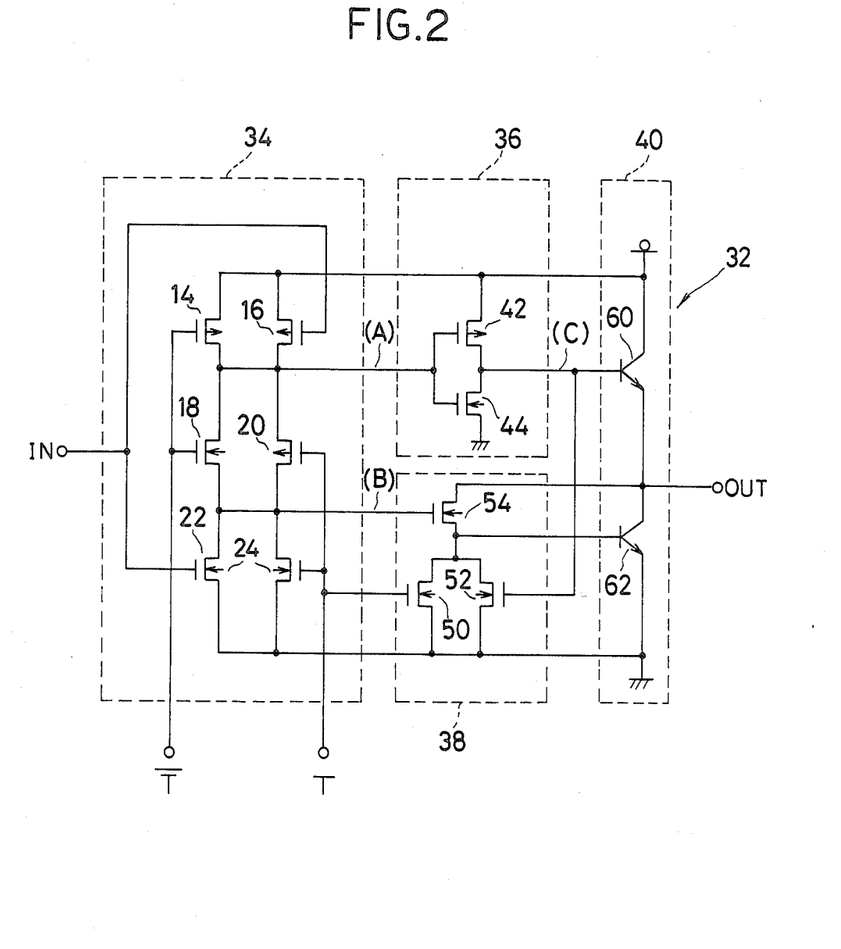
FIG. 2 is a circuit diagram for a tri-state buffer circuit embodying the present invention.

Referring to FIG. 2, a tri-state buffer circuit embodying the present invention is shown with reference numeral 32.

The tri-state buffer circuit 32 comprises a switching unit 34, a driving unit 36, a selection unit 38, and an output unit 40. Here, the switching unit 34 has a composition similar to the switching unit 12 of the prior example shown in FIG. 1.

The driving unit 36 is composed of an inverter circuit that includes a PMOS 42 and an NMOS 44. The source terminal of the PMOS 42 is connected to the voltage source Vcc, the source terminal of the NMOS 44 is connected to the ground, the drain terminals of the PMOS 42 and the NMOS 44 are connected to each other, and their gate terminals are connected to the drain terminals of the PMOS 14 and 16 of the switching unit 34 so that a switching signal (A) generated in the switching unit 34 is supplied to their gate terminals, and a driving signal (C) is output from the drain terminals of the PMOS 42 and the NMOS 44.

The selection unit 38 is composed of NMOS 50 and 52 that are connected in parallel as a result of their drain terminals connected each other and their source terminals are connected respectively to the ground, and NMOS 54 whose source terminal is connected to the drain terminals of the NMOS 50 and 52 that are connected in parallel and whose drain terminal is connected to the output terminal OUT of the tri-state buffer circuit. The switching signal (B) that is generated in the switching unit 34 is supplied to the gate terminal of the NMOS 54 that is connected to the drain terminals of the NMOS 22 and 24 of the switching unit 34. Further, to the gate terminal of the NMOS 50 that is connected to the tri-state terminal T, there is supplied a tri-state signal T, and to the gate terminal of the NMOS 52 that is connected to the drain terminal of the PMOS 42 and the NMOS 44 of the driving unit 36, there is supplied a driving signal (C).

The output unit 40 is composed of NPN bipolar transistors 60 and 62 (hereafter, the NPN bipolar transistor 60 is referred to as "first NPN" and the NPN bipolar transistor 62 is referred to as "second NPN"). The collector terminal of the first NPN is connected to the voltage source Vcc, its emitter terminal is connected to the output terminal OUT, and its base terminal is connected to the drain terminals of the PMOS 42 and the NMOS 44 of the driving unit 36, with supply of a driving signal (C). Further, the collector terminal of the second NPN 62 is connected to the output terminal OUT, its emitter terminal is connected to the ground, and its base terminal is connected to the drain terminals of the NMOS 50 and 52 of the selection unit 38.

Next, the operation of the tri-state buffer circuit 32 will be described.

First, when the tri-state signal T is on "L" level and the inverted tri-state signal T̄ which is the inversion of the tri-state signal is on "H" level, if the input signal is on "L" level, then the switching signals (A) and (B) generated in the switching unit 34 are both on "H" level as mentioned earlier. The switching signal (A) is inverted by the inverter circuit of the driving unit 36 to become a driving signal (C) which is on "L" level. The driving signal (C) is supplied to the base terminal of the first NPN 60 of the output unit 40 and to the gate terminal of the NMOS 52 of the selection unit 38, so that both of these terminals become off-state. Further, the NMOS 54 becomes on-state and the NMOS 50 becomes off-state, and a current flows into the base terminal of the second NPN 62 from, for example, a load capacity connected to the output terminal OUT, via the NMOS 54. As a result the second NPN 62 becomes on-state, a current flows from the load capacity connected to the output terminal OUT to the ground, so that the output terminal OUT becomes "L" level. In addition, when the input signal is on "H" level, both of the switching signals (A) and (B) that are generated in the switching unit 34 become "L" level, as mentioned before. Consequently, the switching signal (A) is inverted by the inverter circuit of the driving unit 36 to become an "H" level driving signal (C) which is supplied to the base terminal of the first NPN 60 of the output unit 40 and to the gate terminal of the NPN 52 of the selection unit 38, making both terminals. Further, the NMOS 54 is in off-state, the NMOS 52 is in on-state, and the base terminal of the second NPN 62 becomes "L" level so that the second NPN 62 becomes off-state. Then, a current flows in from the voltage source Vcc via the first NPN 60 to, for example, a load capacity connected to the output terminal OUT, bringing the output terminal OUT to "H" level.

Moreover, when the tri-state signal T is on "H" level and the inverted tri-state signal $\overline{T}$ is on "L" level, the switching signal (A) generated by the switching becomes "H" level and the switching signal (B) becomes "L" level without depending upon the level of the input signal, namely, for both cases of "L" level and "H" level of input signal. Further, the driving signal that is generated by the driving unit 36 becomes "L" level, and the base of the first NPN 60 becomes "L" level. Moreover, the NMOS 54 and the NMOS 52 of the selection unit 38 become off-state, and the NMOS 50 of the same unit becomes on-state. Consequently, the base of the second NPN becomes "L" level, both of the first and the second NPN 60 and 62 of the output unit 40 become off-state, and the output terminal OUT becomes high impedance (HZ) state.

TABLE 2

| T | $\overline{T}$ | IN | (A) | (B) | (C) | OUT |
|---|---|---|---|---|---|---|
| L | H | L | H | H | L | L |
|   |   | H | L | L | H | H |
| H | L | — | H | L | L | HZ |

Namely, the tri-state buffer circuit with the above construction operates as shown in Table 2. That is, when the tri-state signal T is on "H" level and the inverted tri-state signal $\overline{T}$ is on "L" level, the output becomes high impedance state, and when the tri-state signal T is on "L" level and the inverted tri-state signal $\overline{T}$ is on "H" level, the circuit operates as an ordinary buffer circuit.

Figure 3:
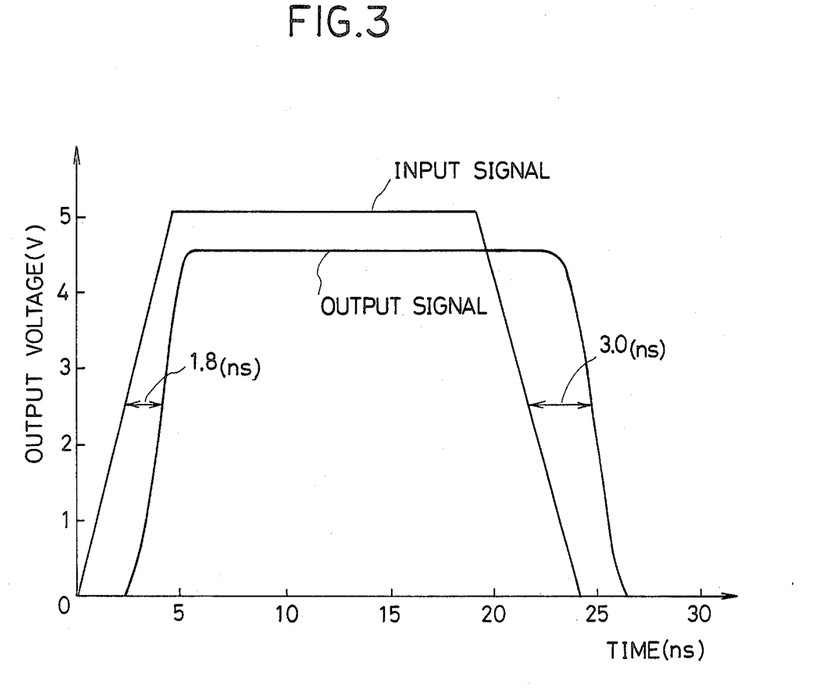
FIG. 3 is a graph for illustrating the simluation results on the delay time of the output signal for the input signal in the tri-state buffer circuit shown in FIG. 2.

Moreover, when an NPN bipolar transistor with an emitter area, for example, of about 150 $\mu m^2$ is used for the output unit 40, the amount of the current flowed out from the output unit 40 becomes about 105 mA (at an output voltage of 2.8 V), and the amount of the current that flows in can be made to have a value of about 54 mA (at an output voltage of 1.0 V). In addition, as shown by the simulation results of FIG. 3, during rise of the input signal, the delay time from the 50% level of the input signal to reach the 50% level of the output signal is 1.8 ns. Further, during fall of the input signal, the delay time from the 50% level of the input signal to reach the 50% level of the output signal is 3.0 ns.

Therefore, with a tri-state buffer circuit of the above construction, it becomes possible to reduce the occupying area of the transistor that constitutes the output unit, to improve sharply the current driving capability, and to carry out high speed operation.

Figure 4:
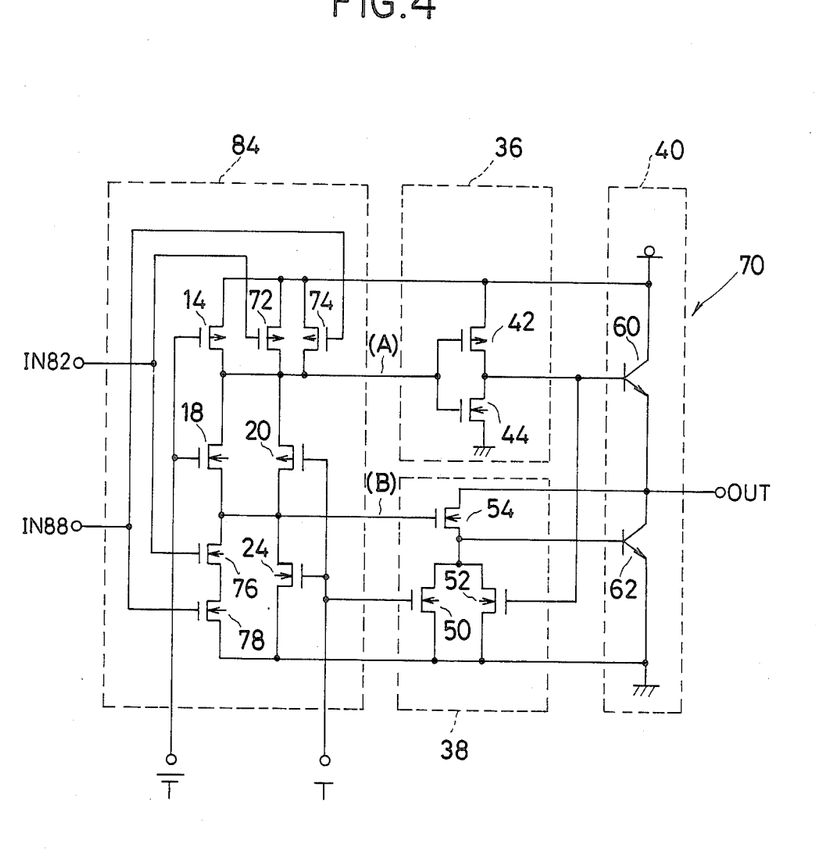
FIG. 4 is a circuit diagram for a tri-state two-input AND circuit in accordance with the present invention.

Referring to FIG. 4, a tri-state two-input AND circuit embodying the present invention is shown with reference numeral 70. The tri-state 2-input AND circuit 70 has a switching unit 84 that is constructed by connecting, for the tri-state buffer circuit shown in FIG. 2, a PMOS 72 and a PMOS 74 in parallel, connecting an NMOS 76 and an NMOS 78 in series, connecting both of the gate terminals of the PMOS 74 and the NMOS 78 to an input terminal IN 80, and connecting both of the gate terminals of the PMOS 72 and the NMOS 76 to an input terminal IN 82. The remaining construction is the same as in the embodiment shown in FIG. 2, and the components with the same symbols as in FIG. 2 designate identical items so that further description is omitted.

TABLE 3

| T | $\overline{T}$ | IN1 | IN2 | (A) | (B) | OUT |
|---|---|---|---|---|---|---|
| L | H | L | L | H | H | L |
|   |   |   | H | H | H | L |
|   |   | H | L | H | H | L |
|   |   |   | H | L | L | H |
| H | L | — | — | H | L | HZ |

A tri-state 2-input AND circuit with the above construction performs logic operations as shown in Table 3. First, when the tri-state signal T is on "L" level and the inverted tri-state signal $\overline{T}$ is on "H", if both of the input signals are on "H" level, both of the switching signals (A) and (B) that are generated in the switching unit 84 both become "L" level, and the output terminal OUT becomes "H" level as mentioned earlier. In addition, when either one of the two input signals is on "L" level, both of the switching signals (A) and (B) become "H" level, and the output terminal OUT becomes "L" level, as mentioned before. Namely, when the tri-state signal T is on "L" level and the inverted tri-state signal $\overline{T}$ is on "H" level, this circuit is seen to operate as an ordinary 2-input AND circuit. Further, when the tri-state signal is on "H" level and the inverted tristate signal $\overline{T}$ is on "L" level, the switching signal (A) becomes "H" level and the switching signal (B) becomes "L" level without depending upon the levels of the two input signals, and the output terminal OUT becomes high impedance state as mentioned earlier.

By giving such a construction, it is possible to realize readily a tri-state 2-input AND circuit that has the same effects as the tri-state buffer circuit from the tri-state buffer circuit shown in FIG. 2.

Figure 5:
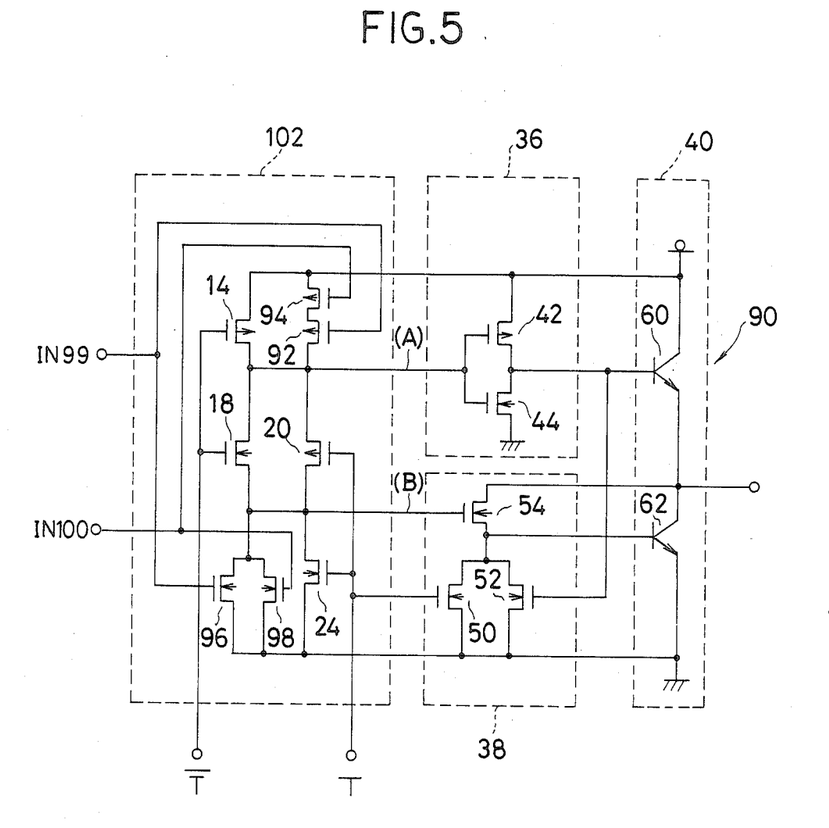
FIG. 5 is a circuit diagram for a tri-state two-input OR circuit in accordance with the present invention.

Referring to FIG. 5, there is shown a tri-state 2-input OR circuit. The tri-state 2-input OR circuit 90 has a PMOS 92 and a PMOS 94 connected in series, and an NMOS 96 and an NMOS 98 connected in parallel, added to the tri-state buffer circuit shown in FIG. 2. Further, it includes a switching unit 102 which is constructed by connecting the gate terminals of both of the PMOS 92 and the NMOS 98 to an input terminal IN 99, and by connecting the gate terminals of both of the PMOS 94 and the NMOS 98 to an input terminal IN 100, and other construction is the same as shown in FIG. 2.

TABLE 4

| T | $\overline{T}$ | IN1 | IN2 | (A) | (B) | OUT |
|---|---|---|---|---|---|---|
| L | H | L | L | H | H | L |
|   |   |   | H | L | L | H |
|   |   | H | L | L | L | H |
|   |   |   | H | L | L | H |
| H | L | — | — | H | L | HZ |

A tri-state 2-input OR circuit constructed as above performs logic operations as shown in Table 4. First, in the state in which the tri-state signal T is on "L" level and the inverted tri-state signal $\overline{T}$ is on "H" level, when both of the input signals are on "L" level, both of the switching signals (A) and (B) that are generated in the switching unit 102 are on "H" level, and the output terminal OUT becomes "L" level, as mentioned earlier. Further, when either one of the two input signals is on "L" level, both of the switching signals (A) and (B) are on "L" level, and the output terminal OUT becomes "H" level, as mentioned earleir. Namely, when the tri-state signal T is on "L" level and the inverted tri-state signal $\overline{T}$ is on "H" level, the circuit operates as an ordinary 2-input OR circuit. Moreover, when the tri-state signal T is on "H" level and the inverted tri-state signal T is on "L" level, the switching signal (A) becomes on "H" level and the switching signal (B) becomes "L", regardless of the levels of the two input signals, and the output terminal OUT becomes high impedance state. Here, elements with the same symbol as in FIG. 2 indicate identical components, and their description is omitted.

With such a construction, it is easy to realize, from the tri-state buffer circuit shown in FIG. 2, a tri-state 2-input OR circuit that has the same effects as the tri-state buffer circuit.

In summary, according to the present invention, an output stage of a tri-state buffer circuit is constructed by connecting, in the so-called totem pole shape, the bipolar transistors that have the characteristics that can be formed with smaller area compared with the MOS transistors but have higher current driving capability. Moreover, in order to carry out the switching operation at high speed, there is provided a control unit that is composed of MOS transistors. As a consequence, it becomes possible to provide a tri-state buffer circuit that can be made small in size, and can carry out the operation at high speed even under the condition of high load capacity.

Various modifications will become possible for those skilled in the art after receiving the teachings of the present disclosure without departing from the scope thereof.

What is claimed is:

1. A tri-state buffer circuit comprising:
   (a) a switching circuit connected to an input terminal (IN), tri-state and inverted tri-state input terminals (T, T) and a power supply terminal for generating first and second switching signals (A, B) which have first and second levels, respectively, only when the tri-state signal is on a first level, regardless of the level of the input signal from the input terminal (IN);
   (b) an inverter circuit connected to said switching circuit, and the power supply terminal for inverting the first switching signal (A) from said switching circuit as an output signal;
   (c) a selection circuit connected to said switching circuit and inverter circuit for maintaining a signal, which has a second level, equal to the inverted signal only when the tri-state signal is on the first level; and
   (d) a first type first bipolar transistor whose base is connected to said inverter circuit, whose collector is connected to the power supply terminal, and whose emitter is connected to the output terminal of the tri-state circuit; and
   (e) a first type second bipolar transistor whose base is connected to said selection circuit, whose collector is connected to the output terminal of the tri-state circuit, and whose emitter is connected to a common return terminal.

2. A tri-state buffer circuit as claimed in claim 1, wherein said inverter circuit has first type and second type MOS transistors each gate of which is connected in parallel to the first output terminal of said switching circuit from which the first switching signal is supplied, each drain of which is connected in parallel to each other as an output terminal thereof, and each source of which is connected to the power supply terminal and the common return terminal, respectively.

3. A tri-state buffer circuit as claimed in claim 1, wherein said selection circuit has a pair of second type MOS transistors each drain of which is connected in parallel to each other as an output terminal, gate of one of which is connected to a tri-state signal input terminal and gate of other of which is connected to the output terminal of said inverter circuit, and each source of which is connected to the common return terminal, and a second type MOS transistor a drain of which is connected to the output terminal (out) of the tri-state circuit, a gate of which is connected to the second output terminal of said switching circuit from which the second switching signal is supplied, and a source of which is connected to the drains of the second type MOS transistors.

4. A tri-state buffer circuit as claimed in claim 3, wherein the first type MOS transistor of said inverter circuit is P type MOS transistor, the second type MOS transistors of said inverter circuit, and said selection circuit are N type MOS transistors, and said first and second first type bipolar transistors are NPN bipolar transsstors.

5. A tri-state buffer circuit comprising:
   (a) a switching circuit having a pair of first type MOS transistors each source of which is connected in parallel to a power supply terminal, and each drain of which is connected in parallel to each other as the first output terminal, a pair of first and second type MOS transistors each drain and source of which are connected in parallel to the first and second output terminals, and a pair of second type MOS transistors each drain of which is connected in parallel to the second output terminal, and each source of which is connected in parallel to a common return terminal; the gate of the first type first MOS transistor of the pair of first type MOS transistors and the gate of the second type MOS transistor of the pair of first and second type MOS transistors being connected in parallel to the inverted tri-state terminal (T̄), the gate of the first type MOS transistor of the pair of first and second type MOS transistors and the gate of the second type second MOS transistor of the pair of second type MOS transistors being connected in parallel to the tri-state terminal (T), and the gate of the first type second MOS transistor of the pair of first type MOS transistors and the gate of the second type first MOS transistor of the pair of second type MOS transistors being connected in parallel to the input terminal (IN);
   (b) an inverter circuit having first type and second type MOS transistors, each gate of which is connected in parallel to the first output terminal of said switching circuit from which the first switching signal is supplied, each drain of which is connected in parallel to each other as an output terminal thereof, and each source of which is connected to the power supply terminal and the common return terminal, respectively;
   (c) a selection circuit having a pair of second type MOS transistors each drain of which is connected in parallel to each other as an output terminal, gate of one of which is connected to a tri-state signal input terminal and gate of other of which is connected to the output terminal of said inverter circuit, and each source of which is connected to ground, and a second type MOS transistor a drain of which is connected to the output terminal (out)

of the tri-state circuit, a gate of which is connected to the second output terminal of said switching circuit from which the second switching signal is supplied, and a source of which is connected to the drains of the second type MOS transistors;

(d) a first type first bipolar transistor whose base is connected to the output terminal of said inverter circuit, whose collector is connected to the power supply terminal, and whose emitter is connected to the output terminal of the tri-state circuit; and (e) a first type second bipolar transistor whose base is connected to the output terminal of said selection circuit, whose collector is connected to the output terminal, and whose emitter is connected to a common return terminal.

6. A tri-state buffer circuit comprising:

(a) a switching circut connected to first and second input terminals (IN 1, IN 2), tri-state and inverted tri-state input terminals (T, T̄), and a power supply terminal for generating first and second switching signals (A, B) which have first and second levels, respectively, only when the tri-state signal is on a first level, regardless of the levels of the input signals from the first and second input terminals (IN 1, IN 2);

(b) an inverter circuit connected to said switching circuit, and the power supply terminal for inverting the first switching signal (A) from said switching circuit as an output signal;

(c) a selection circuit connected to said switching circuit and inverter circuit for maintaining a signal, which have a second level, equal to the inverted signal only when the tri-state signal is on first level; and (d) a first type first bipolar transistor whose base is connected to said inverter circuit, whose collecter is connected to the power supply terminal, and whose emitter is connected to the output terminal of the tri-state circuit; and (e) a first type second bipolar transistor whose base is connected to said selection circuit, whose collecter is connected to the output terminal of the tri-state circuit, and whose emitter is connected to a common return terminal.

* * * * *